(12) United States Patent  
Balkman

(10) Patent No.: US 7,295,654 B2
(45) Date of Patent: Nov. 13, 2007

(54) DIGITAL KICK METER AND GRAPHICAL USER INTERFACE (GUI)

(75) Inventor: William D. Balkman, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 692 days.

(21) Appl. No.: 10/768,244

(22) Filed: Jan. 30, 2004

(65) Prior Publication Data

US 2005/0169436 A1     Aug. 4, 2005

(51) Int. Cl.
H04M 1/24 (2006.01)
H04M 3/08 (2006.01)
H04M 3/22 (2006.01)

(52) U.S. Cl. .......................... 379/24; 379/30; 324/114; 714/46

(58) Field of Classification Search .............. 379/1.01, 379/9.02–9.04, 21, 22.07, 24–25, 26.01, 379/27.01, 27.03, 27.06, 29.04–29.05, 29.1, 379/30; 714/30, 46; 324/114
See application file for complete search history.

(56) References Cited

U.S. PATENT DOCUMENTS

| 4,748,404 | A | * | 5/1988 | Heinze et al. | 324/114 |
| 4,789,824 | A | * | 12/1988 | Henkelmann | 324/114 |
| 5,235,629 | A | * | 8/1993 | Butler et al. | 379/21 |
| 5,606,592 | A | * | 2/1997 | Galloway et al. | 379/30 |
| 5,748,471 | A |  | 5/1998 | Grande |  |
| 6,144,721 | A |  | 11/2000 | Stephens |  |
| 6,438,212 | B1 |  | 8/2002 | Lysaght et al. |  |
| 6,555,731 | B2 |  | 4/2003 | LaChapell et al. |  |
| 6,614,880 | B1 |  | 9/2003 | Lysaght et al. |  |
| 6,856,138 | B2 | * | 2/2005 | Bohley | 324/534 |
| 2002/0123725 | A1 |  | 9/2002 | Lachapell et al. |  |
| 2003/0062911 | A1 | * | 4/2003 | Kao et al. | 324/724 |
| 2005/0232159 | A1 | * | 10/2005 | Joo et al. | 370/241 |
| 2005/0240831 | A1 | * | 10/2005 | Balkman et al. | 714/46 |
| 2006/0139024 | A1 | * | 6/2006 | Newcombe | 324/114 |

FOREIGN PATENT DOCUMENTS

| EP | 0 789 247 A | 8/1997 |
| EP | 0 962 780 A2 | 12/1999 |
| JP | 2001 201519 | 10/2001 |

OTHER PUBLICATIONS

Product Specification, 1137-5000 Sidekick T & N, TEMPO® A Textron Company, p. 1, 2000.

(Continued)

Primary Examiner—Binh K. Tieu
(74) Attorney, Agent, or Firm—John A. Burtis

(57) ABSTRACT

A digital kick meter measures capacitive kick between two conductors and ground of a cable. The digital kick meter includes a resistance measuring circuit connectable to two of the conductors to provide a signal indicative of a capacitance between the two conductors. A filter is coupled to the resistance measuring circuit to filter a signal provided by the resistance measuring circuit, thereby producing a kick signal. Processing circuitry is coupled to the filter, and a graphical user interface (GUI) is coupled to the processing circuitry to display data related to the kick signal. The GUI may include an active bar graph dynamically displaying the kick signal on a graduated scale and retaining a peak value of the kick signal on the graduated scale.

28 Claims, 3 Drawing Sheets

OTHER PUBLICATIONS

Extended Specifications, Fluke 187/198 True-rms Digital Multimeter, $^{SM}$ 2000 Fluke Corporation, pp. 1-3, Document#2153.

Users Manual, Fluke® Model 187 & 189 True RMS Multimeter, Fluke Corporation, Everett, WA, Aug. 2000, Rev. 2, Jun. 2002.

* cited by examiner

DIGITAL KICK METER AND GRAPHICAL USER INTERFACE (GUI)

BACKGROUND OF THE INVENTION

The present invention relates to a digital kick meter, and more particularly to a digital kick meter having a graphical user interface (GUI).

In the telecommunications industry, the distance or status of a communication wire can be measured by a "kick meter" function of a device, sometimes called a "kick test." A kick meter is a device that is used to measure the amount of capacitance, voltage or resistance on a copper telephone wire pair within a cable. The wire pair includes a tip and ring conductor continuously twisted throughout the length of the cable. The overall cable is typically covered with a metallic shield, which is usually grounded. These three conductors are often referred to simply as the "tip, ring and ground" conductors of the cable. The kick test measurement is accomplished using an ohmmeter function of the test device that applies a voltage across the wire pair and displays a value proportional to the current flowing into the pair. The display of this value is usually done with the movement of a mechanical meter such as a needle.

When the voltage is initially applied across the wire pair (tip and ring conductors), the current flowing into the pair will be high due to the charging of the capacitance between the two conductive wires. As the capacitance between the wires becomes charged, the current flowing into the pair decreases exponentially to a negligible amount. The user of the test device observes the needle of the meter "kicking" up to a peak value and then decaying to zero. The user can then reverse the connection of the leads of the ohmmeter to the wire pair, and the meter will "kick" again. This is caused by the current flow being reversed into the wire pair and the capacitance being charged again in the opposite polarity. The reversing of connections can be repeated until the user is able to determine a consistent peak or "kick" value on the meter.

Typically the meter of a test device is marked with graduations from 0 to 100 "points." Generally, the length of a cable and the capacitance between the conductive wires of the pair are proportional to one another. As a result, the "kick" is larger for longer cable lengths. Using a lookup table or a graph, the user can approximate the cable length from the "kick" points value.

In addition, a "kick test" can be performed to determine how well the wire pair is balanced, by comparing the "kick" when the ohmmeter leads are connected to the tip and ground conductors to the "kick" when the ohmmeter leads are connected to the ring and ground conductors. A "kick meter" can also be used to determine if a resistive fault or foreign voltage is present on the pair, by observing whether the value displayed on the meter during certain measurements decays all the way to zero or retains a non-zero value after the decay is complete.

BRIEF SUMMARY OF THE INVENTION

While the function of a traditional analog "kick meter" is quite useful, its use is somewhat antiquated and imprecise. The user of a test device of this kind is forced to observe a transient value, and can only record this value by writing it down on a piece of paper or otherwise recording it with a mechanism that is external to and different from the test device itself. A "kick meter" with an improved operating protocol and user interface would advance the state of the art.

According to an exemplary embodiment of the present invention, a digital kick meter is provided to measure capacitive kick between two conductors of a cable. The digital kick meter includes a resistance measuring circuit connectable to the two conductors to provide a signal indicative of a capacitance between the two conductors. A filter is coupled to the resistance measuring circuit to filter the signal provided by the resistance measuring circuit, thereby producing a kick signal. Processing circuitry is coupled to the filter, and a graphical user interface (GUI) is coupled to the processing circuitry to display data related to the kick signal.

In one exemplary embodiment, the digital kick meter is simultaneously connectable to the tip, ring and ground conductors of a telecommunication cable, and the GUI is operable to select the conductors upon which to perform a kick test and to initiate the kick test.

In a further exemplary embodiment, the GUI includes an active bar graph dynamically displaying the kick signal on a graduated scale and retaining a peak value of the kick signal on the graduated scale.

DETAILED DESCRIPTION

Figure 1:
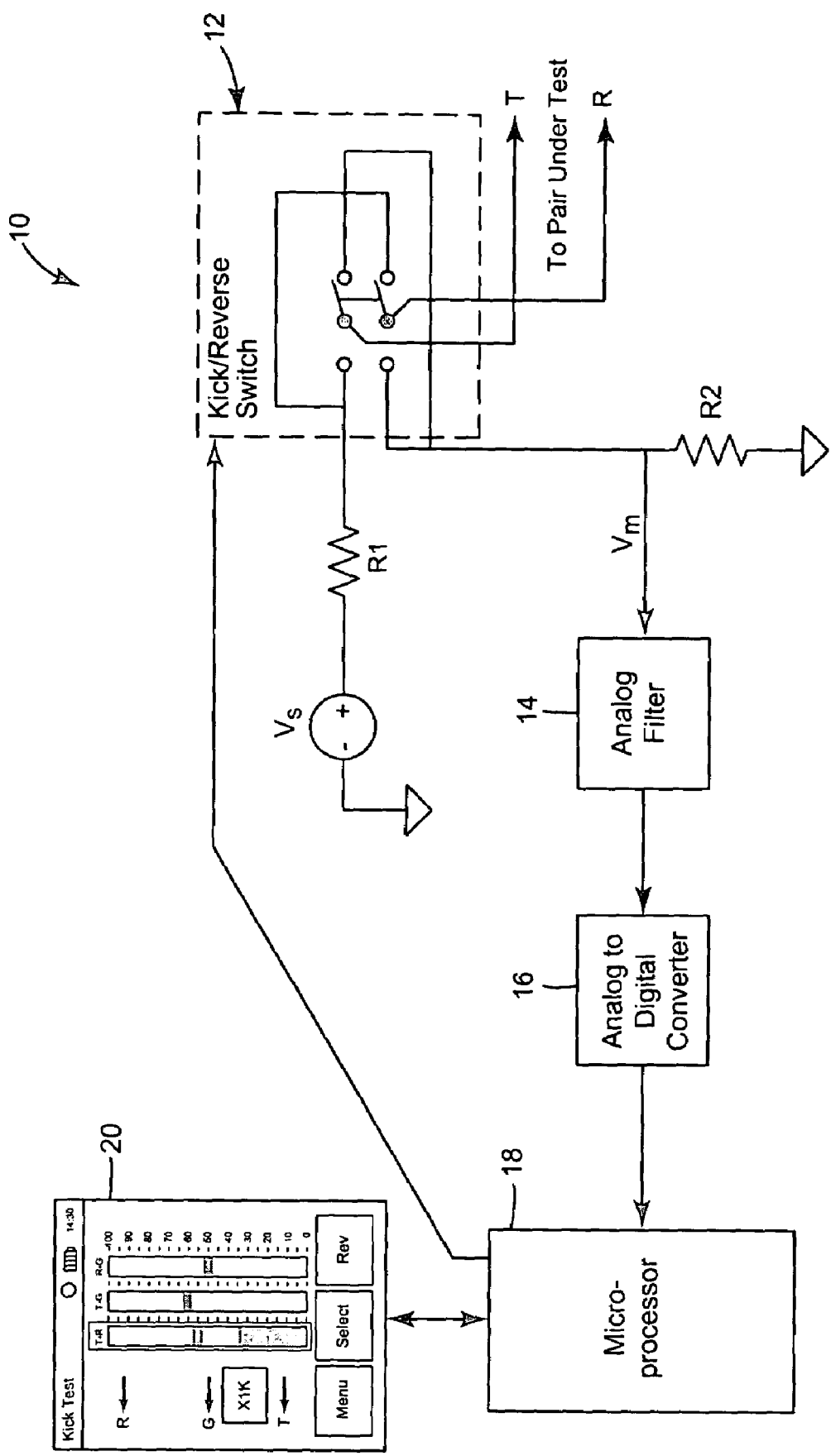
FIG. 1 is a block diagram of an exemplary embodiment of a digital kick meter.

FIG. 1 is a block diagram of an exemplary embodiment of digital kick meter 10. Kick meter 10 includes voltage source $V_S$, resistors R1 and R2, kick/reverse switch 12, analog filter 14, analog-to-digital (A/D) converter 16, microprocessor 18, and graphical user interface (GUI) 20. Voltage source $V_S$ is connected through resistor R1 to kick/reverse switch 12. Kick/reverse switch 12 is configured as a double-pole, double-throw (DPDT) switch in an exemplary embodiment. Alternatively, kick/reverse switch 12 may employ another switching mechanism known in the art, such as one or more relays, for example. Kick/reverse switch 12 is connected to the leads that connect to the conductor pair under test, such as the tip (T) and ring (R) conductors, for example, and is also connected through resistor R2 to ground in a traditional resistance measurement circuit configuration. A voltage $V_M$ is present at the terminal of resistor R2 opposite the grounded terminal, and is connected to analog filter 14. An output of analog filter 14 is connected to A/D converter 16, whose output is in turn connected to microprocessor 18. Microprocessor 18 operates on the signals received from A/D converter 16 to synthesize the data for display on GUI 20.

In operation, the voltage provided by voltage source $V_S$ causes a current to flow through resistor R1, through the resistance between the leads connected between the conductors under test (T and R, for example), and through resistor R2. A larger external resistance Rext between the conductors under test results in a smaller current flowing through resistor R2 and a smaller voltage $V_M$ across resistor R2. Thus, voltage $V_M$ is representative of resistance Rext between the conductors under test, and is given by the following formula:

$$V_M = (V_S * R2)/(R1+R2+Rext) \quad \text{(Eq. 1)}$$

The tip (T) and ring (R) conductors of a copper telecommunication cable is not a simple resistance, but is a capacitive load. Thus, when the kick/reverse switch 12 is thrown, the capacitance between the T and R conductors is quickly charged to the source voltage $V_S$, and the voltage across the T-R capacitance adds to the source voltage and places an initial voltage of $2*V_S$ across the source resistance (R1+R2). The instantaneous value of voltage $V_M$ that appears across resistor R2 is given by the following formula:

$$V_M = (2*V_S*R2)/(R1+R2) \quad \text{(Eq. 2)}$$

Figure 2:
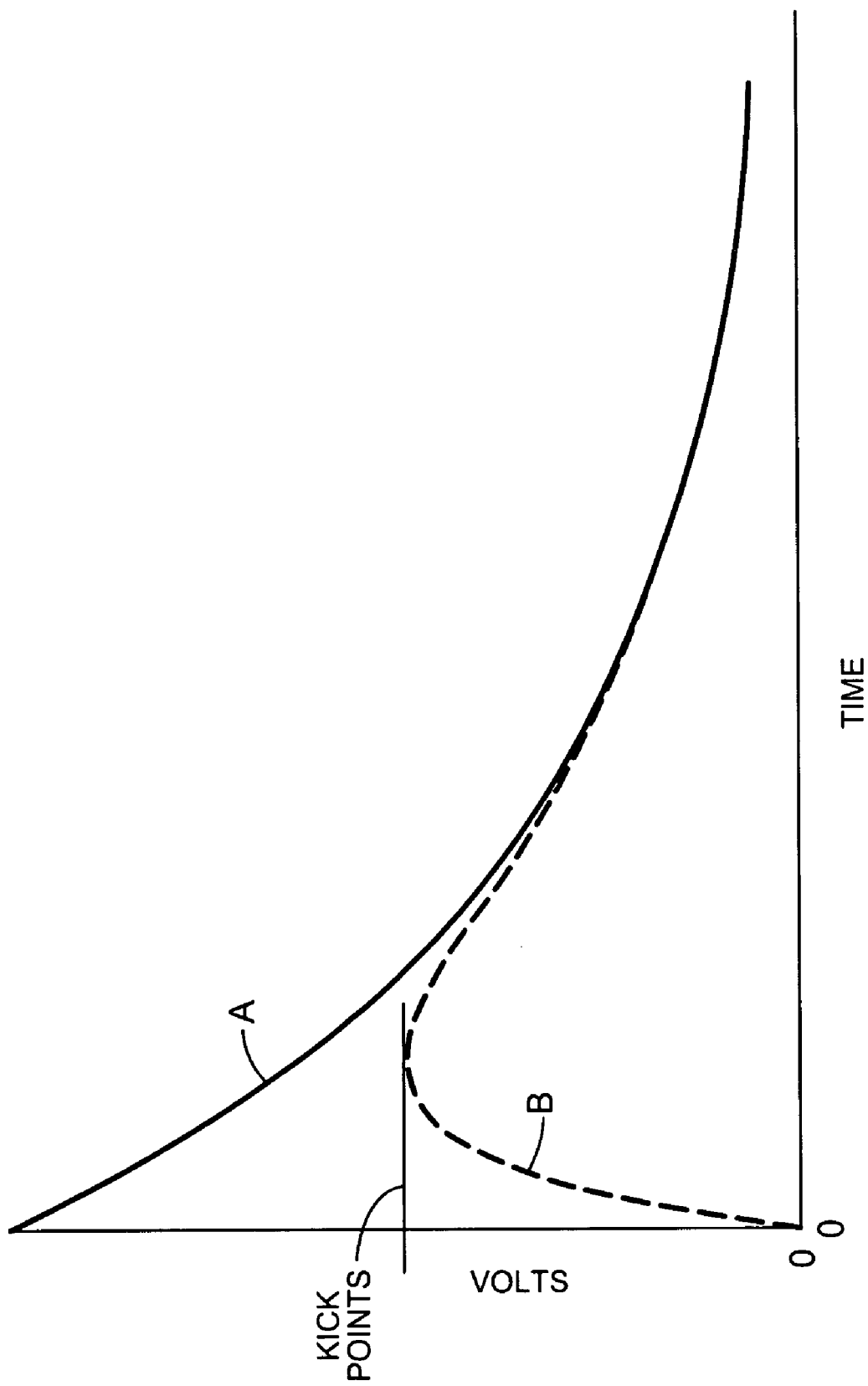
FIG. 2 is a graph illustrating the operation of a kick meter.

Voltage $V_M$ across resistor R2 decays exponentially to zero at a rate that is based on the total value of the source resistance (R1+R2) and the capacitance between the T and R conductors. In traditional analog kick meters, the mass of the needle armature cannot respond immediately to reflect the instantaneous value of voltage $V_M$, and as a result the meter needle rises to a peak value that is less than the instantaneous value of voltage $V_M$ and then decays to zero in a manner that accurately reflects the value of voltage $V_M$. FIG. 2 is a graph that illustrates the kick meter operation, where curve A represents the actual value of voltage $V_M$ following the throwing of the kick/reverse switch, and curve B represents the value of voltage that is reflected by the needle of a traditional kick meter. The peak value to which curve B (the kick meter needle) rises is often referred to as "kick points," and is governed by the decay rate of curve A, which is in turn dependent on the capacitance between the conductors under test. Thus, a given peak value of curve B (the kick meter needle) can be uniquely correlated to a value of the capacitance between the conductors under test. The capacitance between the conductors under test can in turn be correlated to the length of the telecommunication cable, since telecommunication cables are designed with a fixed capacitance (0.083 micro-farads (µF)) per mile.

Because the value of "kick points" is the figure of interest that is used to determine the capacitance and length of a telecommunication cable, digital kick meter 10 (FIG. 1) must employ software or circuitry to perform a filtering operation on the voltage measurement output from the resistance measuring circuit to yield an accurate "kick points" value. This filtering operation is generally performed by a type of low pass filter, responsive to low frequency signals from the resistance measuring circuit. In an exemplary embodiment, the filtering operation simulates the dynamics of the mechanical armature movement of an analog kick meter needle. Referring again to FIG. 1, analog filter 14 operates on the voltage $V_M$ signal (curve A, FIG. 2) appearing across resistor R2 and generates a signal (curve B, FIG. 2) that models the performance of an analog kick meter, taking account of mechanical inertia, momentum and other variables. A/D converter 16 samples this signal and converts it into a series of digital values, including a digital value representing the peak of the signal, which is the "kick points" value. Microprocessor 18 receives the digital values and uses them to operate and display relevant information on GUI 20. In an alternative embodiment, analog filter 14 may be replaced by an equivalent digital filter either between A/D converter 16 and microprocessor 18 or as a part of microprocessor 18 itself, that operates to digitally filter the raw data provided by A/D converter 16.

Figure 3:
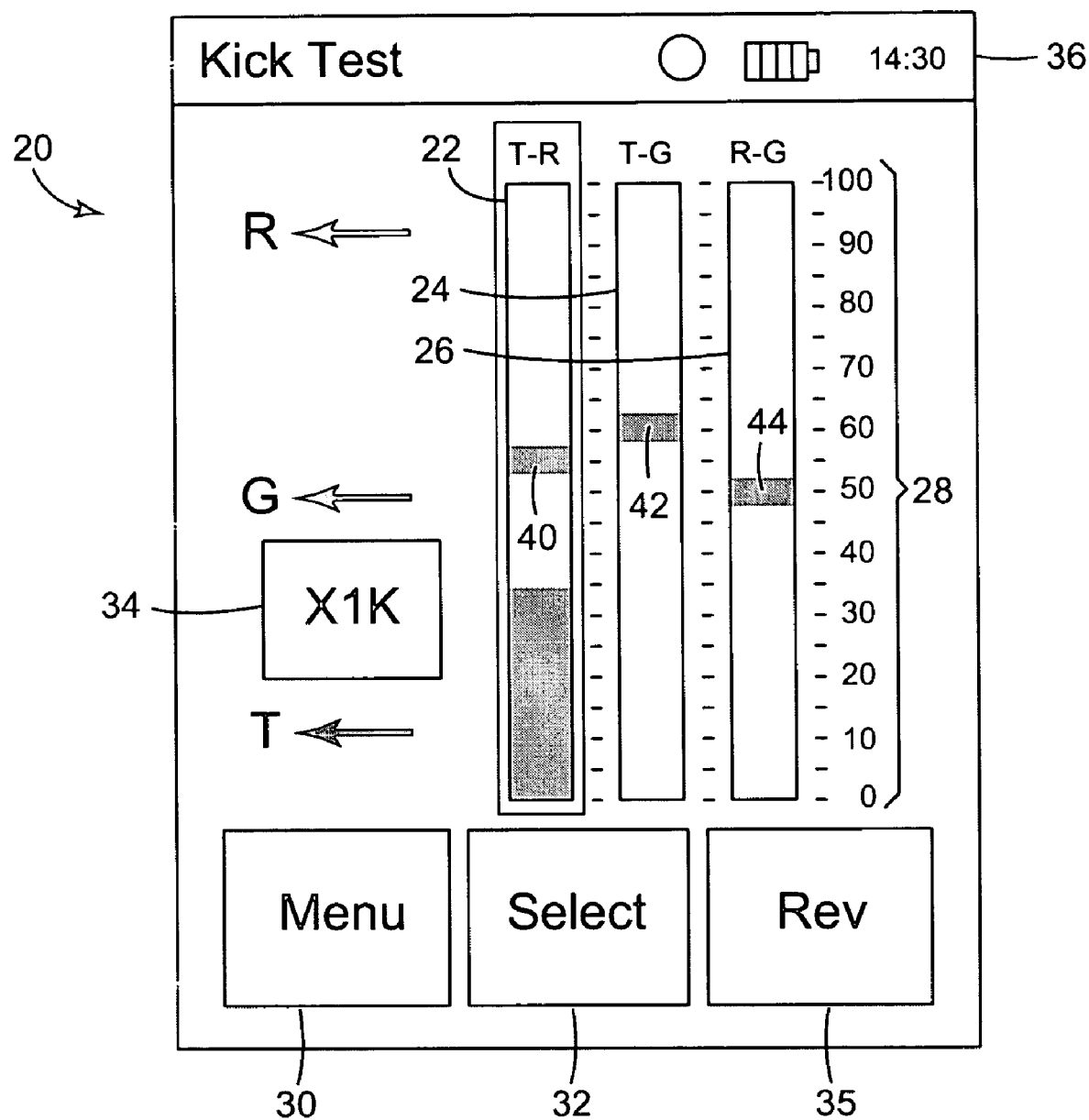
FIG. 3 is a diagram of an exemplary graphical user interface (GUI) for a digital kick meter.

FIG. 3 is a diagram of exemplary graphical user interface (GUI) 20 for a digital kick meter. GUI 20 is typically displayed on a screen of a test device itself or a screen of a unit coupled to the test device. GUI 20 displays tip-to-ring (T-R) points bar graph 22, tip-to-ground (T-G) points bar graph 24, and ring-to-ground (R-G) bar graph 26. GUI 20 also displays graduated scale 28 along bar graphs 22, 24 and 26. Although graduated scale 28 is shown as being common to all three bar graphs 22, 24 and 26 in the exemplary embodiment of FIG. 3, separate scales for bar graphs 22, 24 and 26 could also be employed. The notations "R," "G" and "T" are also displayed by GUI 20 to indicate which two conductors are actively connected to by the test device. In the example shown in FIG. 3, the conductors "R" and "T" are highlighted, indicating that the tip-to-ring (T-R) measurement is active. In addition, bar graph 22 displaying the T-R measurement is highlighted as well, also indicating that the T-R measurement is active and the T-G and R-G measurements are non-active.

GUI 20 also includes user selectable options for controlling the operation of the test device or the display of GUI 20. In the exemplary embodiment shown in FIG. 3, these user selectable options are shown as "Menu" button 30, "Select" button 32, "Rev" (reverse) button 35 and "X1K" button 34. "Menu" button 30, "Select" button 32, "Rev" button 33 and "X1K" button 34 are actually soft buttons on GUI 20 that can typically be activated by a user employing a finger or stylus, for example. "Menu" button 30 is selectable by a user to activate a menu of options for operating the test device and/or controlling the display of GUI 20. "Select" button 32 is selectable by a user to change which measurement is performed by the test device (T-R, T-G or R-G). "Rev" button 35 is selectable by a user to automatically reverse the polarity of the leads connected to the T, R and G conductors to take another capacitive kick measurement. "X1K" button 34 is selectable by a user to adjust the sensitivity of the kick measurement (e.g., to reduce the sensitivity of the measurement for longer cables). The reduction in sensitivity is accomplished in an exemplary embodiment by decreasing the response time of analog filter 14 (FIG. 1). Other arrangements of user selectable options may be used in other embodiments, including the ability to display a numerical peak value for kick measurements, numerical real-time values of kick measurements, or a measure of the capacitive balance of the cable under test, for example. Finally, status information or other optional information may be displayed on GUI 20, such as in header 36 of the exemplary embodiment of FIG. 3.

In operation, the kick meter serves to measure the capacitive kick on two conductors of a telecommunication cable. A user connects test leads to the tip (T) and ring (R) conductors of the cable pair and the ground (G) conductor of the cable, and then has the ability to select which two conductors to test via "Select" button 32. Once the conductors are selected, the user initiates a kick test via "Rev" button 35. The measured signal is dynamically displayed as a bar on the appropriate one of bar graphs 22, 24 and 26, with the peak "kick points" value being retained as a line (40 for T-R bar graph 22, 42 for T-G bar graph 24, and 44 for R-G bar graph 26) on the bar graph display. The scale shown on graduated scale 28 may reflect "kick points" as has been traditionally used in the art to determine cable length, or may utilize the computational power of the digital kick meter to display cable length directly on graduated scale 28, as well as capacitance or other parameters that would enable the user to determine desired properties of the cable under test. The computational power of the digital kick meter 10 also enables further computations to be performed automatically for the user and displayed separately to reflect characteristics of the cable under test, such as cable length, pair balance, a numeric peak value, a real-time bar graph value, or other characteristics. Since the kick measurement is live and continuous, any changes in capacitance, resistance, or voltage on the selected conductor pair will be reflected immediately in the display. In some embodiments, additional circuitry may be included to allow live kick measurements to be made on all pairs of conductors (T-R, T-G and R-G) simultaneously.

In order to accurately measure the peak of the "kick" signal (curve B shown in FIG. 2), the digital kick meter must have a relatively fast resistance measurement update rate, which conventional ohmmeters do not require and therefore typically do not have. Some digital multimeters have a graphical type of display which employs a relatively fast update rate, but these types of meters do not have the ability to make a quantitative measurement, cannot retain a peak value of a signal on the display as is required for an accurate "kick" measurement, do not include an appropriate GUI for initiating a kick test and manipulating various kick configurations and measurements, and do not employ filtering to model the performance of an analog kick meter so as to produce a "kick points" reading used in the art to determine cable length. The digital kick meter disclosed herein provides all of the functionality of a traditional analog kick meter by modeling the analog kick meter's response so that a true measure of "kick points" can be produced. In addition, the digital kick meter has improved functionality and ease of use, retaining the peak "kick" value for easy reading by the user, providing automatic conductor selection and measurement sensitivity adjustment on the GUI, and operating at a relatively fast update rate to obtain an accurate "kick" measurement.

EXAMPLE

An exemplary configuration of digital kick meter 10, as shown in FIG. 1, employs a 100 volt DC source as voltage source $V_s$, a 97.5 kilo-ohm (kΩ) resistor as resistor R1, and a 2.5 kΩ resistor as resistor R2 (giving a total source resistance (R1+R2) of 100 kΩ). For these component values, the instantaneous value of voltage $V_M$ across resistor R2 upon initiating a kick test is 5 volts. Thus, curve A shown in FIG. 2 peaks at 5 volts at the initial time, and decays toward zero. Curve B shown in FIG. 2 peaks at approximately 2.5 volts in this example, and then also decays towards zero.

In this exemplary configuration of digital kick meter, the resistance measurement update rate is about ten times per second or higher (in contrast to a typical resistance measurement device not designed as a kick meter which has an update rate of about three times per second). This fast update rate permits accurate measurement of the peak of the rapidly changing "kick" signal. The upper limit of the measurement update rate is limited by the hardware and software employed in the resistance measurement circuit (how quickly it can respond and make measurements), but its sampling rate must be fast enough to capture sufficient kick measurement samples during the kick test to ensure that the peak kick value is sampled and not missed.

The component values given in this Example are for purposes of illustration rather than of limitation. For example, the source resistance (R1+R2) can typically range from 50 kΩ to 150 kΩ, and the source voltage $V_S$ can range from 50 volts to 150 volts. Generally, source voltage $V_S$ needs to be high enough to provide a reasonable signal to noise measurement ratio. However, there is a practical limit on the size of the source voltage, since the higher the source voltage, the greater the risk of a user receiving a severe electrical shock from the test leads. The source resistance (R1+R2) can be adjusted in coordination with the source voltage to provide an adequate measurement signal over the range of interest.

Although the present invention has been described with reference to exemplary embodiments, workers skilled in the art will recognize that changes may be made in form and detail without departing from the spirit and scope of the invention.

The invention claimed is:

1. A digital kick meter for measuring capacitive kick between two conductors of a cable, comprising:
   a resistance measuring circuit connectable to the two conductors to provide a signal indicative of a capacitance between the two conductors;
   a filter to operate on the signal provided by the resistance measuring circuit and produce a resulting kick signal;
   processing circuitry coupled to the filter; and
   a graphical user interface coupled to the processing circuitry to display data related to the kick signal.

2. The digital kick meter of claim 1, wherein the filter is operable to simulate a response of a mechanical kick meter.

3. The digital kick meter of claim 1, wherein the graphical user interface is operable to display a peak value of the kick signal.

4. The digital kick meter of claim 1, wherein the graphical user interface dynamically displays the kick signal on a graduated scale.

5. The digital kick meter of claim 4, wherein the graduated scale is graduated in units of "kick points."

6. The digital kick meter of claim 4, wherein the graduated scale is graduated in units of cable length.

7. The digital kick meter of claim 4, wherein the graphical user interface retains a peak value of the kick signal on the graduated scale.

8. The digital kick meter of claim 1, wherein the graphical user interface is operable to initiate a kick test by the resistance measuring circuit.

9. The digital kick meter of claim 1, wherein the resistance measuring circuit is simultaneously connectable to tip, ring and ground conductors of a teleconununication cable, and the graphical user interface is operable to select two of the tip, ring and ground conductors upon which to perform a kick test.

10. The digital kick meter of claim 1, having a resistance measurement update rate of at least ten times per second.

11. The digital kick meter of claim 1, wherein the graphical user interface comprises a menu control operable by the user to selectively adjust operation and display of the graphical user interface.

12. A digital kick meter for measuring capacitive kick between two conductors of a telecommunication cable having tip, ring and ground conductors, comprising:
   a resistance measuring circuit simultaneously connectable to the tip, ring and ground conductors of the telecommunication cable, the resistance measuring circuit having a kick/reverse switch to selectively initiate and control a polarity of connection to two of the tip, ring and ground conductors of the telecommunication cable;
   a graphical user interface operable to control the kick/reverse switch to selectively operate the resistance measuring circuit so that a signal is provided indicative of a capacitance between the two conductors of the telecommunication cable connected to the resistance measuring circuit;

a filter to operate on the signal provided by the resistance measuring circuit and produce a resulting kick signal; and processing circuitry coupled to the filter to process the kick signal and provide data related to the kick signal for display on the graphical user interface.

13. The digital kick meter of claim 12, wherein the filter is operable to simulate a response of a mechanical kick meter.

14. The digital kick meter of claim 12, wherein the graphical user interface is operable to display a peak value of the kick signal.

15. The digital kick meter of claim 12, wherein the graphical user interface dynamically displays the kick signal on a graduated scale.

16. The digital kick meter of claim 15, wherein the graduated scale is graduated in units of "kick points."

17. The digital kick meter of claim 15, wherein the graduated scale is graduated in units of cable length.

18. The digital kick meter of claim 15, wherein the graphical user interface retains a peak value of the kick signal on the graduated scale.

19. The digital kick meter of claim 12, having a resistance measurement update rate of at least ten times per second.

20. A method of digitally measuring capacitive kick between two conductors of a cable, comprising:

connecting a resistance measuring circuit to the two conductors;

selectively controlling a polarity of the connection to the two conductors to provide a first signal indicative of a capacitance between the two conductors;

filtering the first signal to produce a kick signal;

processing the kick signal to provide data related to the kick signal; and displaying the data related to the kick signal on a graphical user interface.

21. The method of claim 20, wherein filtering the first signal to produce a kick signal comprises modeling a response of a mechanical kick meter to the first signal.

22. The method of claim 20, wherein displaying the data related to the kick signal on the graphical user interface comprises displaying a peak value of the kick signal.

23. The method of claim 20, wherein displaying the data related to the kick signal on the graphical user interface comprises dynamically displaying the kick signal on a graduated scale.

24. The method of claim 23, wherein the graduated scale is graduated in units of "kick points."

25. The method of claim 23, wherein the graduated scale is graduated in units of cable length.

26. The method of claim 23 wherein displaying the data related to the kick signal on the graphical user interface further comprises retaining a peak value of the kick signal on the graduated scale.

27. The method of claim 20, wherein the resistance measuring circuit is operated with a resistance measurement update rate of at least ten times per second.

28. The method of claim 20, wherein connecting the resistance measuring circuit to the two conductors comprises simultaneously connecting tip, ring and ground conductors of a telecommunication cable to the resistance measuring circuit, and further comprising:

selecting two of the tip, ring and ground conductors upon which to perform a kick test.

* * * * *

UNITED STATES PATENT AND TRADEMARK OFFICE
CERTIFICATE OF CORRECTION

PATENT NO. : 7,295,654 B2
APPLICATION NO. : 10/768244
DATED : November 13, 2007
INVENTOR(S) : William D. Balkman It is certified that error appears in the above-identified patent and that said Letters Patent is hereby corrected as shown below:

Title Page,
Item [56] References Cited, under Other Publications, Page 2, Col. 1, delete ""$^{SM}$ 2000" and insert --© 2000--, therefor.

Column 1,
Line 47, delete ""kick" points" and and insert --"kickpoints"--, therefor.

Column 3,
Line 4, in Eq. 1, delete "$V_M$-" and insert --$V_M$=--, therefor.

Column 5,
Line 39, delete "$V_s$," and insert --$V_S$,--, therefor.

Column 6,
Line 43, in Claim 9, delete "teleconununication" and insert --telecommunication--, therefor.

Signed and Sealed this

Fifteenth Day of April, 2008

JON W. DUDAS
*Director of the United States Patent and Trademark Office*